United States Patent
Hong et al.

(10) Patent No.: US 9,541,811 B2
(45) Date of Patent: Jan. 10, 2017

(54) THIN FILM TRANSISTOR ARRAY PANEL AND MANUFACTURING METHOD THEREOF

(71) Applicant: Samsung Display Co., Ltd., Yongin, Gyeonggi-do (KR)

(72) Inventors: Pil Soon Hong, Gwangmyeong-si (KR); Gwui-Hyun Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/740,433

(22) Filed: Jun. 16, 2015

(65) Prior Publication Data
US 2016/0195746 A1    Jul. 7, 2016

(30) Foreign Application Priority Data

Jan. 2, 2015 (KR) ........................ 10-2015-0000231

(51) Int. Cl.
| | | |
|---|---|---|
| H01L 29/04 | (2006.01) | |
| G02F 1/1368 | (2006.01) | |
| G02F 1/1343 | (2006.01) | |
| H01L 27/12 | (2006.01) | |
| G02F 1/1362 | (2006.01) | |

(52) U.S. Cl.
CPC ......... *G02F 1/1368* (2013.01); *G02F 1/13439* (2013.01); *G02F 1/134309* (2013.01); *H01L 27/124* (2013.01); *H01L 27/1259* (2013.01); *G02F 2001/136222* (2013.01)

(58) Field of Classification Search
CPC .............. G02F 1/1368; G02F 1/134309; G02F 1/13439; G02F 2001/136222; H01L 27/124; H01L 27/1259
See application file for complete search history.

(56) References Cited

U.S. PATENT DOCUMENTS

| | | | | |
|---|---|---|---|---|
| 2005/0134779 | A1* | 6/2005 | Park ................. | G02F 1/136286 349/139 |
| 2009/0225017 | A1* | 9/2009 | Kim .................. | G02F 1/133514 345/88 |
| 2009/0251631 | A1* | 10/2009 | Kim .................. | G02F 1/133514 349/48 |

(Continued)

FOREIGN PATENT DOCUMENTS

| | | |
|---|---|---|
| JP | 2002-341363 A | 11/2002 |
| JP | 2007-256795 A | 10/2007 |

(Continued)

*Primary Examiner* — Thanh Y Tran
(74) *Attorney, Agent, or Firm* — Cantor Colburn LLP (57) ABSTRACT

A thin film transistor array panel includes: a gate line and a data line on a substrate, insulatively crossing each other; a thin film transistor connected to the gate line and to the data line; a first color filter overlapping the thin film transistor; a second color filter overlapping the first color filter; a passivation layer covering the first color filter and the second color filter; a first pixel electrode on the passivation layer, the first pixel electrode overlapping the first color filter and the second color filter; and a second pixel electrode on the first pixel electrode, the second pixel electrode overlapping the first color filter and the second color filter and connected with a drain electrode of the thin film transistor.

17 Claims, 11 Drawing Sheets

(56) References Cited

U.S. PATENT DOCUMENTS

2011/0216276 A1* 9/2011 Yang .................. G02F 1/1335
349/108
2015/0185541 A1* 7/2015 Lee .................. G02F 1/133345
349/48

FOREIGN PATENT DOCUMENTS

| KR | 1020080093515 A | 10/2008 |
| KR | 1020100022402 A | 3/2010 |
| KR | 1020140086395 A | 7/2014 |

* cited by examiner

THIN FILM TRANSISTOR ARRAY PANEL AND MANUFACTURING METHOD THEREOF

This application claims priority to Korean Patent Application No. 10-2015-0000231 filed on Jan. 2, 2015, and all the benefits accruing therefrom under 35 U.S.C. §119, the entire contents of which are incorporated herein by reference.

BACKGROUND (a) Field

The invention relates to a thin film transistor array panel and a manufacturing method thereof.

(b) Description of the Related Art

A liquid crystal display has advantages of relatively low operational voltage and power consumption, and being portable. Thus, applications of the liquid crystal display to, for example, a laptop computer, a monitor, a spacecraft and an airplane are wide and various.

The liquid crystal display includes two display panels including field generating electrodes such as a pixel electrode and a common electrode, and a liquid crystal layer interposed between the two display panels. The liquid crystal display generates an electric field in the liquid crystal layer by applying voltage to the field generating electrodes, determines the direction of liquid crystal molecules of the liquid crystal layer by the generated electric field, and controls polarization of incident light so as to display images.

SUMMARY

Among various liquid crystal displays, a color filter on array ("COA") structure-based liquid crystal display has been developed, in which a switching element array and color filters are disposed within a same display panel such as being disposed in a thin film transistor array display panel.

One or more exemplary embodiment of the invention provides a thin film transistor array panel of a COA structure-based liquid crystal display and a manufacturing method thereof in which the effect of a step difference between color filters is reduced or effectively prevented.

An exemplary embodiment of the invention provides a thin film transistor array panel including: a gate line and a data line on a substrate, insulatively crossing each other; a thin film transistor connected to the gate line and to the data line; a first color filter overlapping the thin film transistor; a second color filter overlapping the first color filter; a passivation layer covering the first color filter and the second color filter; a first pixel electrode on the passivation layer, the first pixel electrode overlapping the first color filter and the second color filter; and a second pixel electrode on the first pixel electrode, the second pixel electrode overlapping the first color filter and the second color filter and connected with a drain electrode of the thin film transistor.

The first pixel electrode and the second pixel electrode may include a same material and the same material may be indium zinc oxide ("IZO").

The first pixel electrode may have a thickness of less than about 300 angstroms.

The first pixel electrode may be between the second pixel electrode and the first color filter and may be between the second pixel electrode and the second color filter.

The second pixel electrode may contact the drain electrode of the thin film transistor.

Another exemplary embodiment of the invention provides a manufacturing method of a thin film transistor array panel, including: forming a thin film transistor on a substrate, connected to a gate line and a data line which insulatively cross each other; forming a first color filter overlapping the thin film transistor; forming a second color filter overlapping the first color filter on the thin film transistor; forming a passivation layer covering the first color filter and the second color filter; forming a first pixel electrode on the passivation layer, the first pixel electrode overlapping the first color filter and the second color filter; and forming a second pixel electrode on the first pixel electrode, the second pixel electrode overlapping the first color filter and the second color filter and connected with a drain electrode of the thin film transistor.

The forming the passivation layer may include forming a passivation layer material to cover the drain electrode of the thin film transistor and to cover the first color filter and the second color filter.

The forming the first pixel electrode may include forming a first pixel electrode material on an entire surface of the passivation layer; forming a photosensitive film on the first pixel electrode material; removing a portion of the photosensitive film at a predetermined region overlapping the drain electrode of the thin film transistor to expose the first pixel electrode material, by etching the photosensitive film; and removing a portion of the first pixel electrode material on the passivation layer to expose the passivation layer, by etching the first pixel electrode material, the removed portion of the first pixel electrode material formed in the predetermined region overlapping the drain electrode of the thin film transistor.

The etching the first pixel electrode may include a wet etching process.

The method may further include removing the portion of the passivation layer exposed by the removed portion of the first pixel electrode material to expose the drain electrode of the thin film transistor, by etching the passivation layer, the removed portion of the passivation layer formed in the predetermined region overlapping the drain electrode of the thin film transistor.

The etching the passivation layer may include a dry etching process.

The forming the second pixel electrode may include removing the photosensitive film formed on the first pixel electrode material; and forming a second pixel electrode material covering the first pixel electrode material from which the photosensitive film is removed and covering the drain electrode of the thin film transistor.

The method may further include patterning the first and second pixel electrode material to form the first and second pixel electrodes on the passivation layer, respectively.

According to one or more exemplary embodiment of the invention, within a thin film transistor array panel of a color filter on array structure-based liquid crystal display, contamination of the color filter with a liquid crystal layer and a panel spot phenomenon generated due to a step between overlapping the color filters in a structure are reduced or effectively prevented.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a thin film transistor array panel and a manufacturing method thereof according to the invention will be described in detail with reference to the accompanying drawings.

Figure 1:
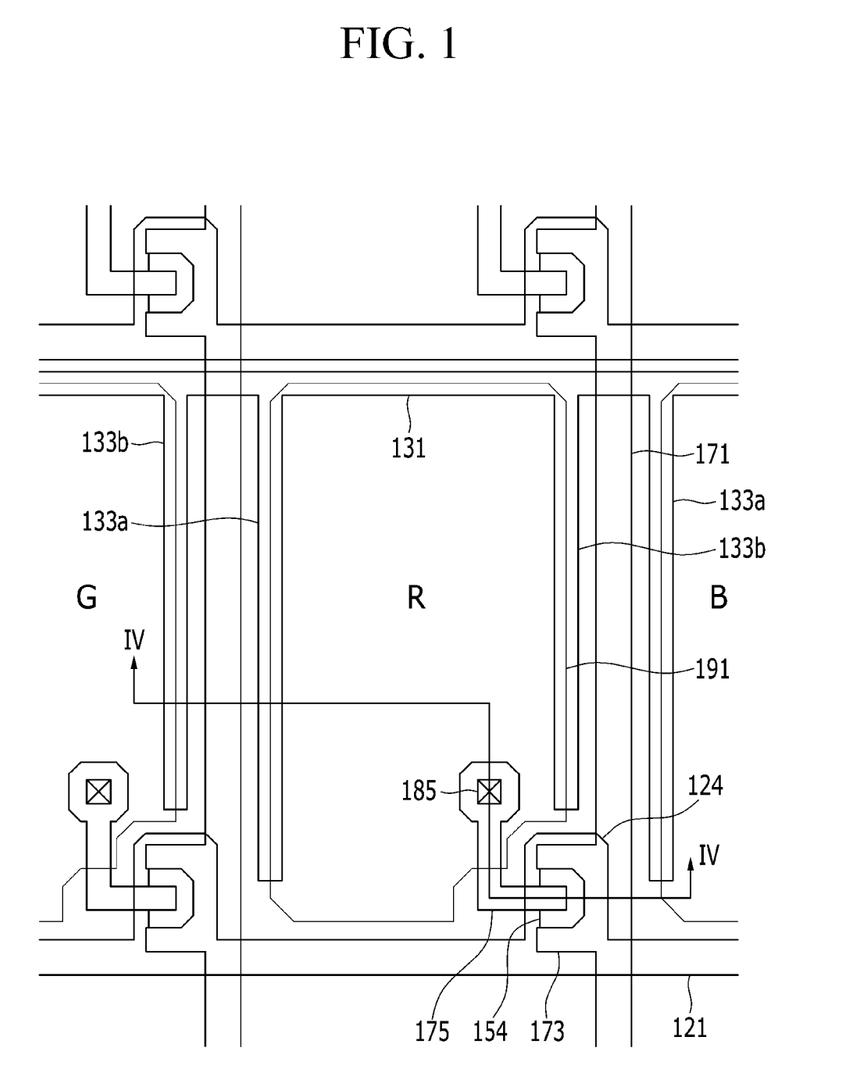
FIG. 1 is a plan view of an exemplary embodiment of a thin film transistor array panel according to the invention.
Figure 2:
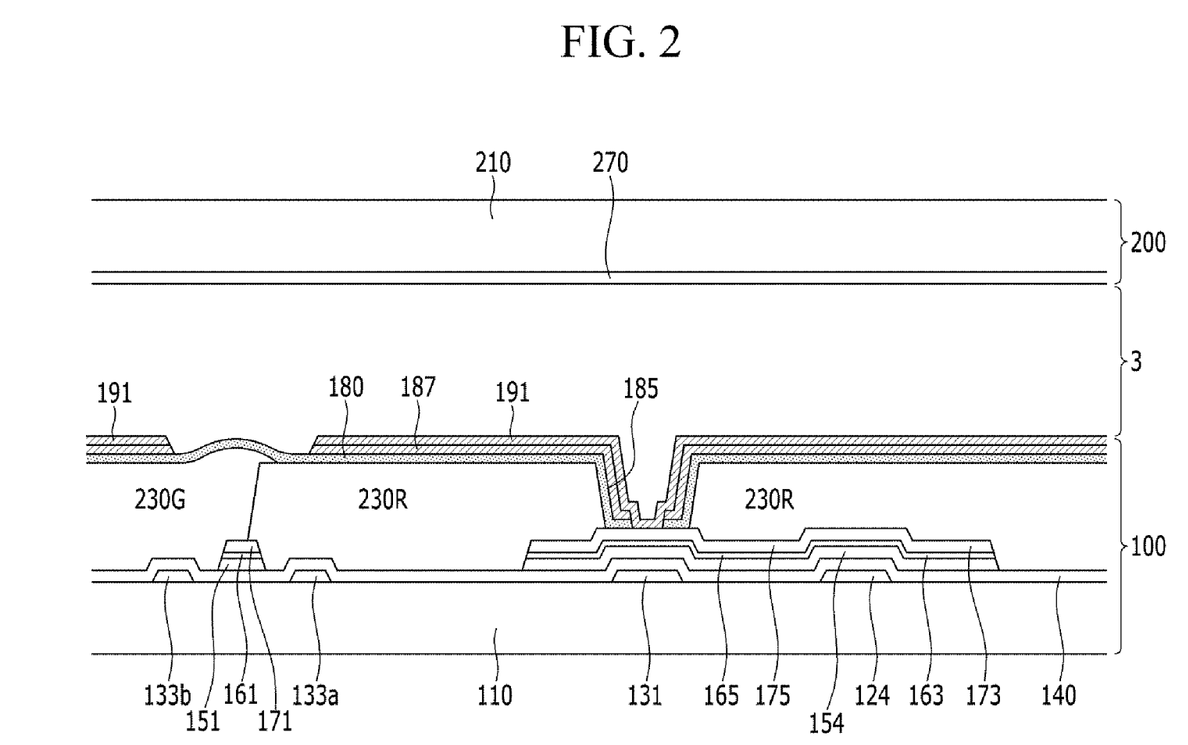
FIG. 2 is a cross-sectional view taken along line IV-IV of FIG. 1.

FIG. 1 is a plan view of an exemplary embodiment of a thin film transistor array panel according to the invention, and FIG. 2 is a cross-sectional view taken along line IV-IV of FIG. 1.

Referring to FIGS. 1 and 2, a liquid crystal display includes a thin film transistor array panel 100, a common electrode panel 200 facing the thin film transistor array panel 100, and a liquid crystal layer 3 interposed between the two display panels 100 and 200.

First, the thin film transistor array panel 100 will be described.

A plurality of gate lines 121 and a plurality of storage electrode lines 131 are disposed on a first insulation substrate 110 including transparent glass or plastic.

The gate lines 121 transfer gate signals and are elongated to extend mainly in a horizontal direction in the plan view. Each gate line 121 includes a plurality of gate electrodes 124 protruding downward from a main portion thereof, and a wide end portion (not illustrated) for connection with another layer or an external driving circuit. A gate driving circuit (not illustrated) which generates a gate signal may be installed on a flexible printed circuit film (not illustrated) attached onto the first insulation substrate 110, may be installed directly on the first insulation substrate 110, or may be integrated in the first insulation substrate 110. When the gate driving circuit is integrated on the first insulation substrate 110, the gate line 121 is extended to be directly connected to the gate driving circuit.

The storage electrode line 131 receives a predetermined voltage. The storage electrode line 131 includes a stem line elongated to extend parallel with the gate line 121, and a plurality of pairs of first and second storage electrodes 133a and 133b which are protruded from the stem line. Each of the storage electrode lines 131 is positioned between two gate lines 121 adjacent in a vertical direction of the plan view, and the stem line is closer to an upper gate line among the two adjacent gate lines 121 between which is disposed the storage electrode line 131. Each of the storage electrodes 133a and 133b has a fixed end connected with the stem line and a free (e.g., distal or terminal) end which is opposite to the fixed end. The fixed end of the first storage electrode 133a has a relatively large area, and the free end thereof is divided into two parts, that is, a linear portion and a curved portion. However, the shape and the layout of the storage electrode line 131 may be variously modified.

A gate insulating layer 140 including silicon nitride (SiNx) or silicon oxide (SiOx) is disposed on the gate line 121 and the storage electrode line 131.

A plurality of semiconductor stripes 151 including hydrogenated amorphous silicon (herein, amorphous silicon is abbreviated to "a-Si"), polysilicon, or the like is disposed on the gate insulating layer 140. The semiconductor stripe 151 is elongated to mainly extend in the vertical direction, and includes a plurality of projections 154 protruding from a main portion thereof toward the gate electrode 124. The semiconductor stripe 151 includes a relatively wide portion near the gate line 121 and the storage electrode line 131 as compared to a remaining portion thereof, such that the relatively wide portion covers the gate line 121 and the storage electrode line 131.

A plurality of ohmic contact stripes and islands 161 and 165 are disposed on the semiconductors 151 and 154, respectively. The ohmic contacts 161 and 165 may include a material such as phosphorus or silicide. The ohmic contact stripe 161 has a plurality of projections 163 protruded from a main portion thereof, and the projection 163 and the ohmic contact island 165 together make a pair of ohmic contacts disposed on the projection 154 of the semiconductor 151.

A plurality of data lines 171 and a plurality of drain electrodes 175 are disposed on the ohmic contacts 161 and 165.

The data lines 171 transfer data signals and are elongated to mainly extend in the vertical direction to cross the gate lines 121. Each data line 171 crosses the storage electrode line 131 and is disposed elongated between sets of adjacent storage electrodes, a set of adjacent storage electrodes including the first and second storage electrodes 133a and 133b. Each data line 171 includes a plurality of source electrodes 173 which extends from a main portion thereof toward the gate electrode 124, and a relatively wide end portion (not illustrated) for connection with another layer or an external driving circuit. A data driving circuit (not illustrated) which generates a data signal may be installed on a flexible printed circuit film (not illustrated) attached onto the first insulation substrate 110, may be installed directly on the first insulation substrate 110, or may be integrated on the first insulation substrate 110. When the data driving circuit is integrated on the first insulation substrate 110, the data line 171 is extended to be directly connected to the data driving circuit.

The drain electrode 175 is separated from the data line 171 and faces the source electrode 173 with respect to the gate electrode 124. Each drain electrode 175 includes a relatively wide first end portion and a rod-shaped second end portion. The relatively wide first end portion overlaps with the storage electrode line 131, and the rod-shaped second end portion is partially surrounded by the curved source electrode 173.

One gate electrode 124, one source electrode 173 and one drain electrode 175 form one thin film transistor ("TFT") together with the projection 154 of the semiconductor 151. A channel of the TFT is positioned at the projection 154 exposed between the source electrode 173 and the drain electrode 175.

The ohmic contacts 161 and 165 exist only between the semiconductor 151 therebelow and the data line 171 and the drain electrode 175 thereabove, and lower contact resistance therebetween, respectively.

The semiconductor 151 may have substantially the same planar shape as the data line 171, the drain electrode 175 and the ohmic contacts 161 and 165 therebelow. However, a portion of the semiconductors 151 and 154 is exposed between the source electrode 173 and the drain electrode 175.

Within the TFT array panel 100, on the gate line 121 and the data line 171, a light blocking member (not illustrated) is disposed. Color filters 230R, 230G and 230B are disposed in pixel areas of the liquid crystal display partitioned by the light blocking member. A passivation layer 180 is disposed on the color filters 230R, 230G and 230B. In the passivation layer 180 and the color filters 230R, 230G, and 230B, a contact hole 185 is defined exposing the drain electrode 175.

The passivation layer 180 includes an inorganic insulating material or an organic insulating material, and a surface thereof may be substantially flat. An example of the inorganic insulating material may include silicon nitride and silicon oxide. The organic insulating material may have photosensitivity, and a dielectric constant thereof may be about 4.0 or less. The passivation layer 180 may include a monolayer of the above-described materials, but the invention is not limited thereto. In an exemplary embodiment, the passivation layer 180 may have a double-layered structure of a lower inorganic layer and an upper organic layer. In an exemplary embodiment of manufacturing a liquid crystal display, the double-layered structure of the passivation layer 180 may reduced or effectively prevent damage to the exposed semiconductor 151 portion while maintaining an excellent insulating characteristic of the organic layer.

Within the TFT array panel 100, on the passivation layer 180, a first pixel electrode 187 and a second pixel electrode 191 are sequentially disposed. The first pixel electrode 187 is disposed on the passivation layer 180 in a region overlapping the color filters 230R, 230G and 230B and electrically connected with the drain electrode 175 via the second pixel electrode 191 to receive a data voltage from the drain electrode 175. The second pixel electrode 191 is disposed directly on the first pixel electrode 187, is physically and electrically connected with the drain electrode 175 via the contact hole 185, and receives the data voltage from the drain electrode 175. The first pixel electrode 187 and the second pixel electrode 191 each include a transparent conductive material, and the second pixel electrode 191 and the first pixel electrode 187 contact each other to receive the same data voltage from the drain electrode 175. As a result, the first pixel electrode 187 and the second pixel electrode 191 forming a multilayer pixel electrode member play the same role as monolayer pixel electrode.

In an exemplary embodiment of manufacturing a liquid crystal display, the first pixel electrode 187 serves as an etch stopper. The first pixel electrode 187 effectively reduces or stops portions of the passivation layer 180 overlapping the color filters 230R, 230G and 230B from being etched or over-etched during a step of removing a portion of the passivation layer 180 overlapping the drain electrode 175 to define the contact hole 185.

The first pixel electrode 187 and the second pixel electrode 191 may include or be formed from a same material as each other. In an exemplary embodiment of manufacturing a liquid crystal display, when the first pixel electrode 187 is formed from the same material as the second pixel electrode 191, an etch characteristic of the two electrodes 187 and 191 may be easily controlled due to the same etch characteristic caused by the same material when the contact hole 185 is formed to expose the drain electrode 175. That is, when the first pixel electrode 187 includes the same material as the second pixel electrode 191, a rate of change during a subsequent pixel pattering process may be minimized.

As the transparent electrode material used to form the first pixel electrode 187 and the second pixel electrode 191, indium zinc oxide ("IZO") may be used but the invention is not limited thereto. The IZO has excellent dry-etch resistance when etching the passivation layer 180 because an indium material and a zinc material do not generate a volatile material when using general dry-etch gas in a dry-etch process.

The common electrode panel 200 faces the TFT array panel 100 and includes a second insulation substrate 210 and a common electrode 270 disposed thereon. However, in an exemplary embodiment, the common electrode 270 may be disposed within the TFT array panel 100. The liquid crystal layer 3 is positioned between the common electrode panel 200 and the TFT array panel 100.

The second pixel electrode 191 to which the data voltage is applied generates the electric field with the common electrode 270 to determine directions of liquid crystal molecules of the liquid crystal layer 3 between the two electrodes 191 and 270. The pixel electrode 191 and the common electrode 270 form a capacitor (hereinafter, referred to as a "liquid crystal capacitor") to maintain the applied voltage even after the TFT is turned off.

The first pixel electrode 187 overlaps the first and second storage electrodes 133a and 133b, and the second pixel electrode 191 overlaps the storage electrode line 131 including the first and second storage electrodes 133a and 133b. A capacitor formed when the second pixel electrode 191, and the drain electrode 175 electrically connected with the second pixel electrode 191, each overlap the storage electrode line 131 is called a storage capacitor, and the storage capacitor reinforces voltage storage capacity of the liquid crystal capacitor.

The liquid crystal layer 3 is positioned between the common electrode panel 200 and thin film transistor array panel 100.

Hereinafter, a manufacturing method of the TFT array panel of the liquid crystal display illustrated in FIGS. 1 and 2 will be described in detail with reference to FIGS. 3 to 10.

FIGS. 3 to 10 are cross-sectional views sequentially illustrating an exemplary embodiment of a manufacturing method of the TFT array panel according to the invention.

Figure 3:
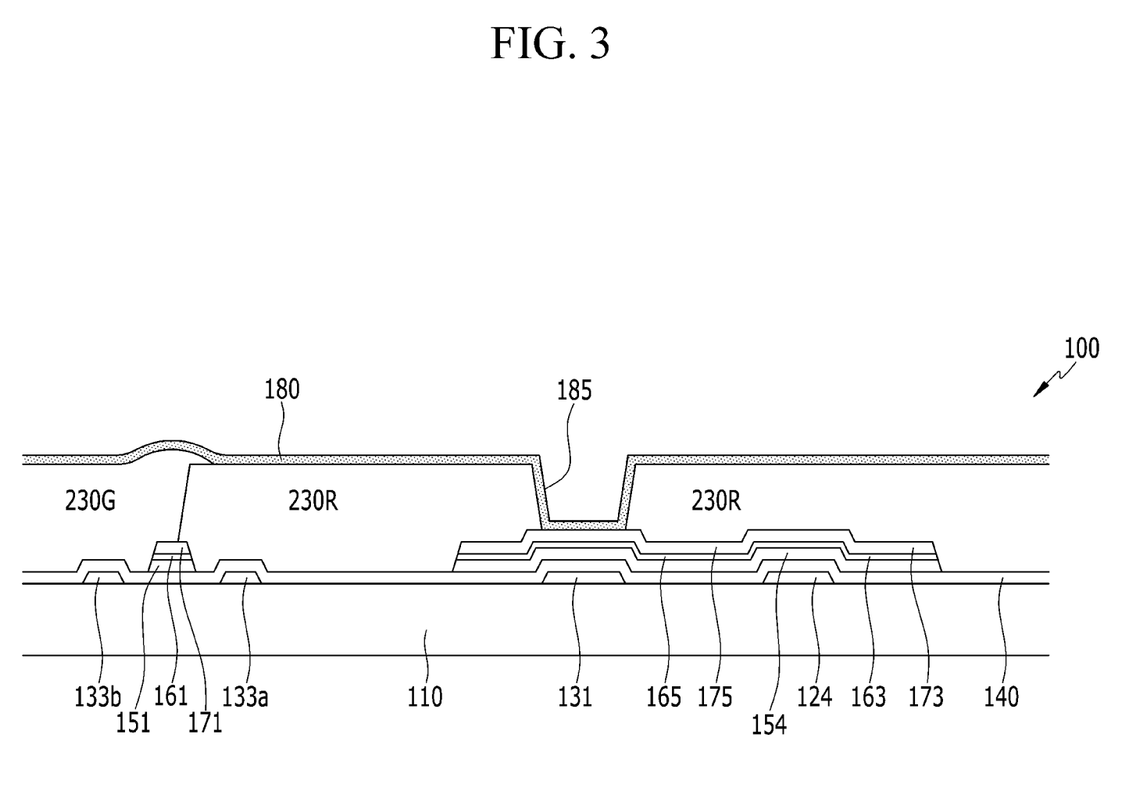
FIGS. 3 to 10 are cross-sectional views illustrating an exemplary embodiment of manufacturing method of the thin film transistor array panel according to the invention.

As illustrated in FIG. 3, in the TFT array panel according to the invention, the plurality of gate lines 121 each including the gate electrode 124 and the end portion (not illustrated) and the plurality of storage electrode lines 131 including the first and second storage electrodes 133a and 133b are formed such as by laminating and photolithographing a metal layer which is disposed on the first insulation substrate 110 such as by sputtering and the like.

In addition, the gate insulating layer 140 is laminated, and the intrinsic semiconductor stripe 151 including the projection 154, the plurality of ohmic contacts 161, 163 and 165, the plurality of data lines 171 including the source electrode 173 and the end portion, and the plurality of drain electrodes 175 are formed thereon.

Subsequently, the color filters 230R, 230G and 230B are formed in regions partitioned by the light blocking member (not illustrated), respectively. The color filters are laminated by sequentially coating, exposing and developing red 230R, green 230G and blue 230B color filter material. The green color filter 230G overlaps the red color filter 230R at a boundary therebetween, and the blue color filter 230B overlaps the green color filter 230G at a boundary therebetween. As a result of the overlapping color filters adjacent to each other, a step is generated. Referring to FIG. 3, for example, the step is illustrated by the protruding upper portion of the color filter 230G overlapping the color filter 230R.

A layer of passivation layer 180 material is formed on the entire surface of the first insulation substrate 110 and contacts the drain electrode 175 exposed at the contact hole 185. The passivation layer 180 material contacts the drain electrode 175 and sides of the color filters 230R, 230G and 230B at the first contact hole 185 defined in the color filters 230R, 230G, and 230B. The area of the contact hole 185 is considered a predetermined region where the pixel electrode 191 will be connected to (i.e., contact) the drain electrode 175. The passivation layer 180 material has a predetermined thickness on an upper surface of the drain electrode 175 in the predetermined region at which the pixel electrode 191 will be connected to (i.e., contact) the drain electrode 175, as illustrated in FIG. 3.

Figure 4:
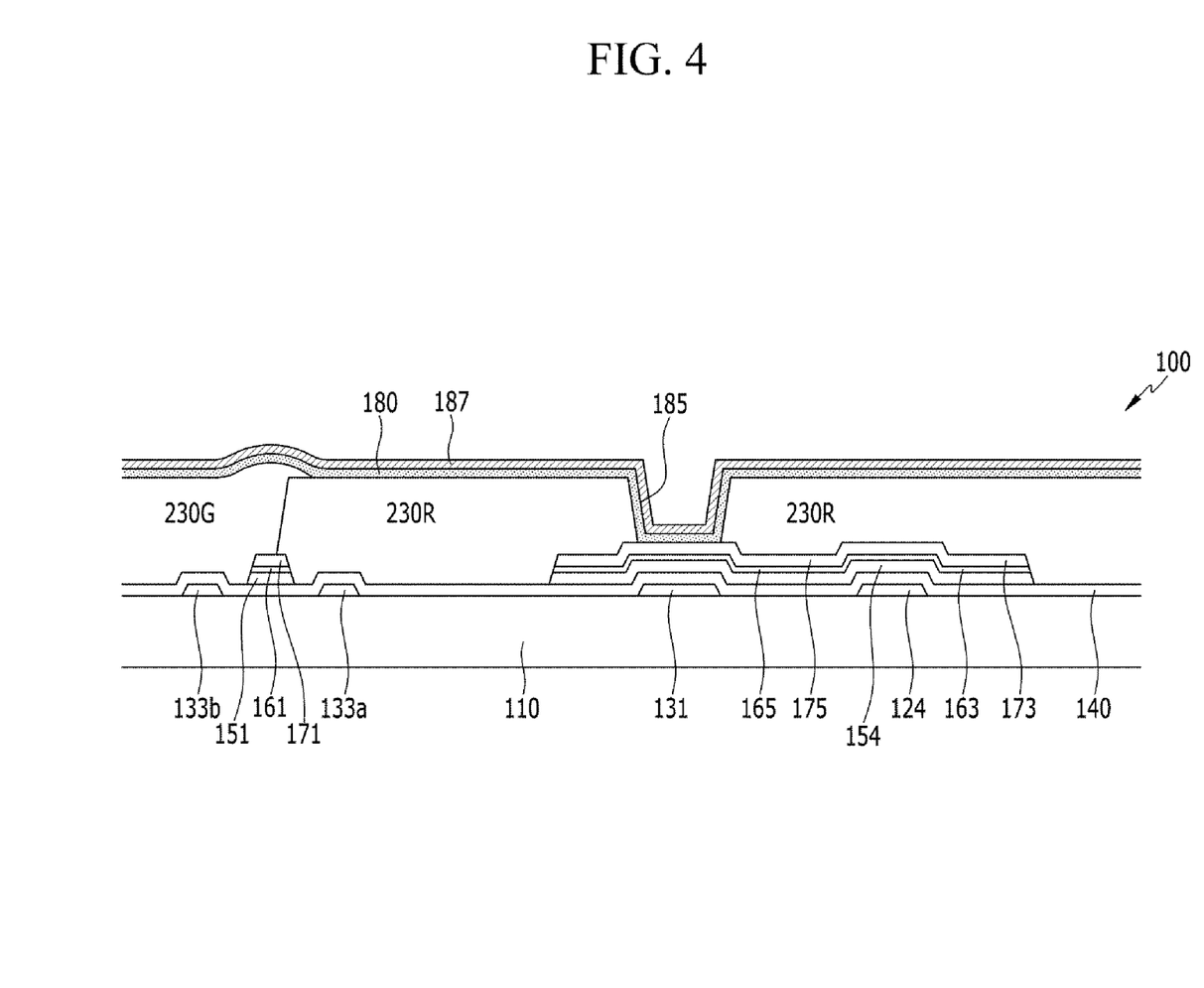

As illustrated in FIG. 4, a layer of first pixel electrode 187 material is formed on the entire surface of the layer of passivation layer 180 material on the first insulation substrate 110. As a result, the layer of passivation layer 180 material and the layer first pixel electrode 187 material are sequentially formed on the drain electrode 175 in the predetermined region at which at which the pixel electrode 191 will be connected to (i.e., contact) the drain electrode 175.

The first pixel electrode 187 may be formed from the same transparent electrode material as the second pixel electrode 191 facing the liquid crystal layer 3.

When the first pixel electrode 187 is formed from the same material as the second pixel electrode 191, etching may be easily controlled due to the same etch characteristic according to the same material such as during a wet etching process. That is, when the first pixel electrode 187 is formed from the same material as the second pixel electrode 191, a rate of change generated during a subsequent pixel pattering process may be minimized.

Figure 5:
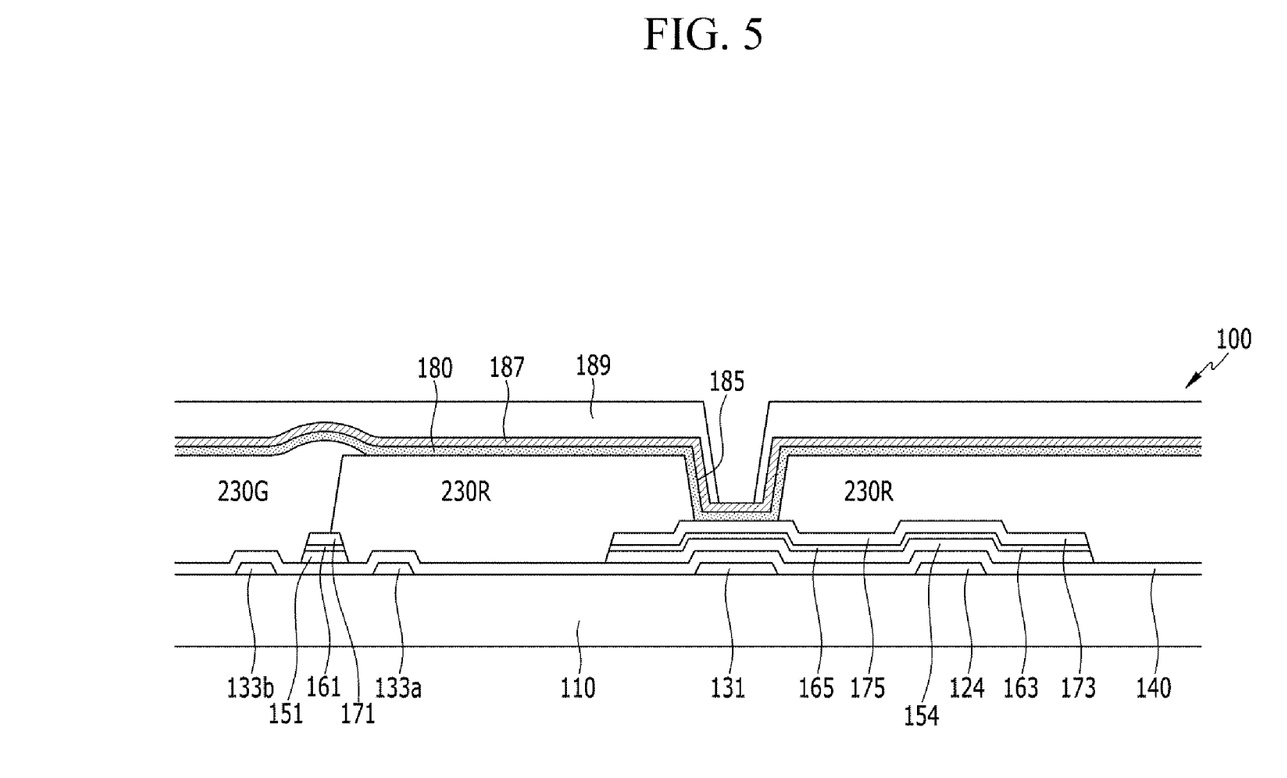

As illustrated in FIG. 5, a planarized photosensitive film 189 material is formed on the layer of the first pixel electrode 187 material, and the photosensitive film 189 material is exposed and developed at the predetermined region at which at which the pixel electrode 191 will be connected to (i.e., contact) the drain electrode 175. The exposed and developed photosensitive film 189 material exposes the layer of the first pixel electrode 187 material at the contact hole 185.

Owing to the planarized photosensitive film 189 and the step difference at the overlapping color filters, a cross-sectional thickness of the photosensitive film 189 on the overlapping portion of the color filters is smaller than that of the photosensitive film 189 on remaining portions thereof such as those portions non-overlapping the color filters. In an exemplary embodiment, for example, an initial thickness of the photosensitive film 189 formed on the overlapping portion of the color filters may be about 0.6 micrometer (μm) to about 1.0 μmm. At portions overlapping the color filters, the thickness of the photosensitive film 189 is taken from an upper surface of the layer of the first pixel electrode 187 material.

The photosensitive film 189 material formed on the drain electrode 175 in the predetermined region at which the pixel electrodes 187 and 191 will be connected with the drain electrode 175 is removed at the contact hole 185 such as by patterning the photosensitive film 189 material.

Figure 6:
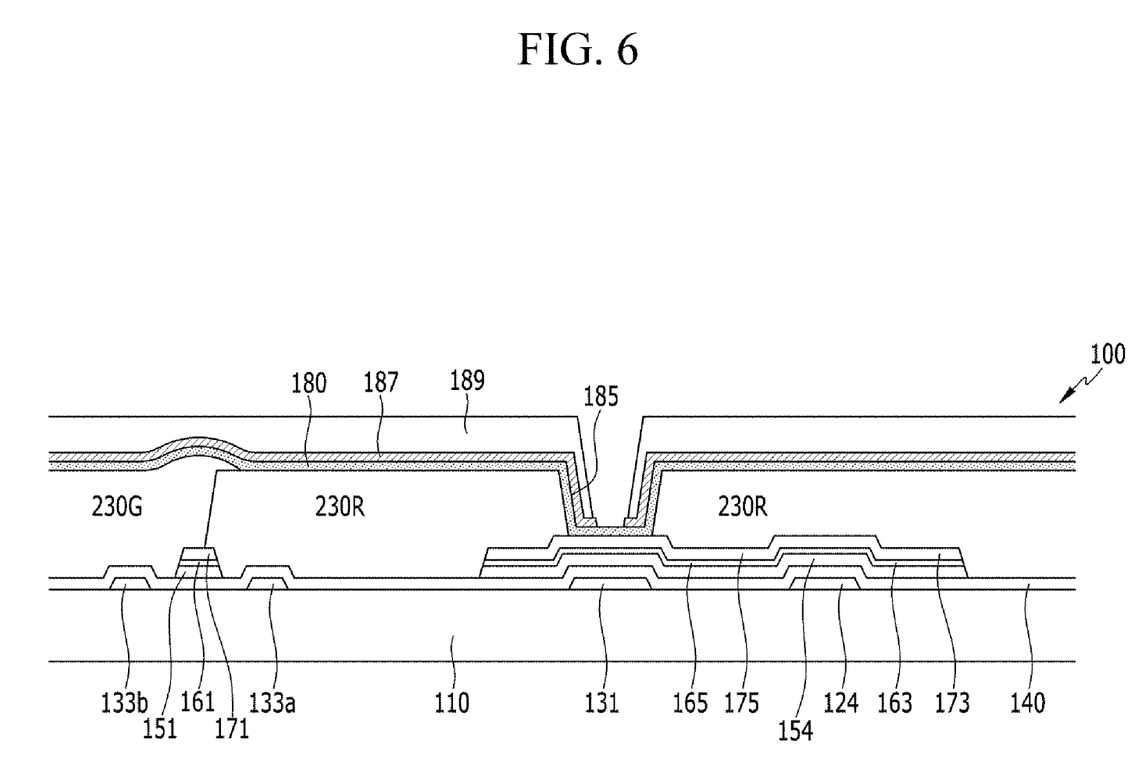

As illustrated in FIG. 6, a primary etching process is performed to remove a portion of the layer of the first pixel electrode 187 material formed on the drain electrode 175 in the predetermined region at which the pixel electrode 191 will be connected to (i.e., contact) the drain electrode 175. As the primary etching process for removing the portion of the layer of the first pixel electrode 187 material in the predetermined region, wet etching may be used. During the wet etching, the photosensitive film 189 formed overlapping the color filters 230R, 230G and 230B and the initial thickness thereof may be maintained. As a result, the layer passivation layer 180 material is exposed on the drain electrode 175 in the predetermined region at which the pixel electrode 191 will be connected to (i.e., contact) the drain electrode 175.

Figure 7:
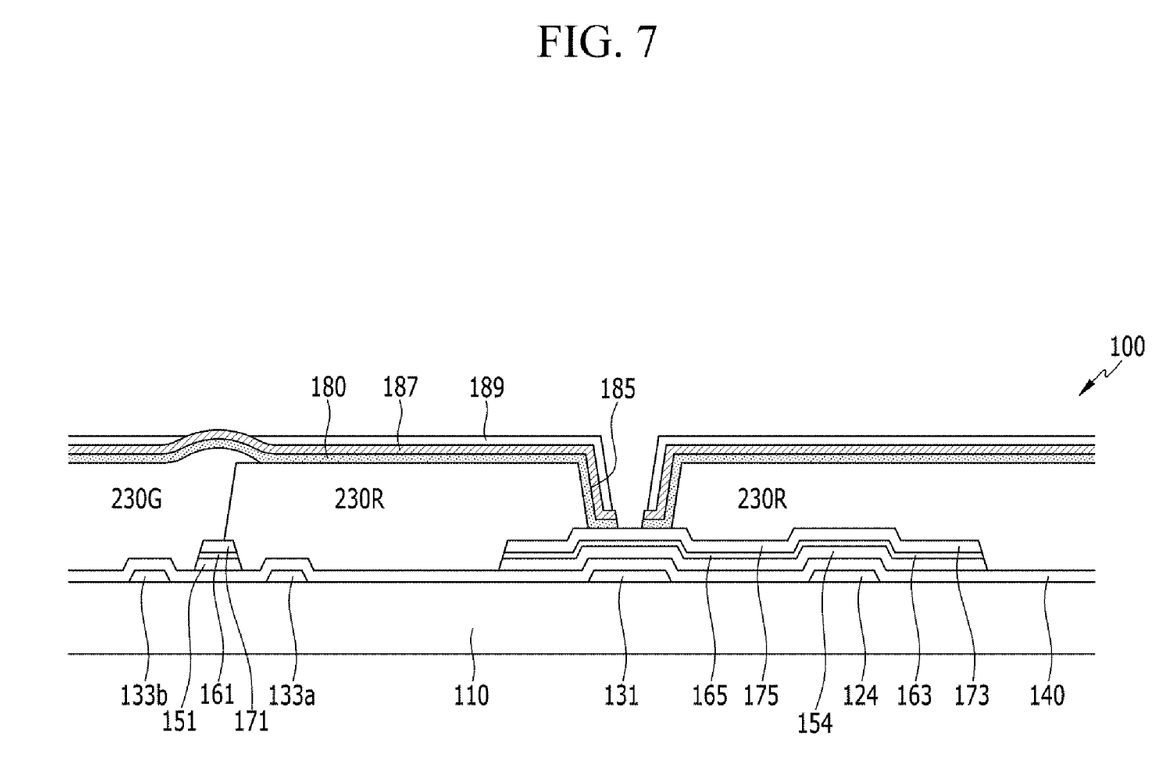

As illustrated in FIG. 7, a secondary etching process is performed to remove a portion of the layer of the passivation layer 180 material formed on the drain electrode 175 in the predetermined region at which the pixel electrode 191 will be connected to (i.e., contact) the drain electrode 175. As the secondary etching process, plasma dry etching may be used. In the secondary etching process including the dry etching method, the layer of the passivation layer 180 material formed on the drain electrode 175 and the photosensitive film 189 formed on the entire surface of the color filters 230R, 230G and 230B may be etched. In the etching of the layer of the passivation layer 180 material formed on the drain electrode 175 and the photosensitive film 189 of the secondary etching process, the passivation layer 180 material formed on the drain electrode 175 is removed to expose the drain electrode 175 while a thickness of the photosensitive film 189 is reduced. The thickness of the photosensitive film 189 may be taken from a common reference such as an upper surface of the first insulation substrate 110.

According to the thickness of the layer of the passivation layer 180 material and the thickness of the photosensitive film 189, an etching speed and an etching time vary. Referring to FIG. 7, a portion of the photosensitive film 189 is fully removed at the overlapping portion of the color filters to expose the layer of the first pixel electrode 187 material while the thickness of remaining portions thereof is reduced such that a thinner portion of the photosensitive film 189 remains on the layer of the first pixel electrode 187 material.

In an exemplary embodiment, for example, in the secondary etching process, an etching rate of the photosensitive film 189 may be on average about 0.8 μm to about 1.0 μm per unit of time. Where the initial thickness of the photosensitive film 189 formed at the overlapping portion of the color filters being about 0.6 μm to about 1.0 μm is applied with the above-described average etching rate, the layer of the first pixel electrode 187 material or the layer of the passivation layer 180 material may be exposed at the overlapping portion of the color filters after the secondary etching process.

However, in the exemplary embodiment, the layer of the first pixel electrode 187 material formed on the overlapping portion of the color filters 230R, 230G and 230B serves as the etch stopper in the secondary etching process. As a result, even though the photosensitive film 189 in the region of the overlapping portion of the color filters 230R, 230G and 230B is completely removed in the dry etching process, etching of the underlying color filter may be reduced or effectively prevented.

Figure 8:
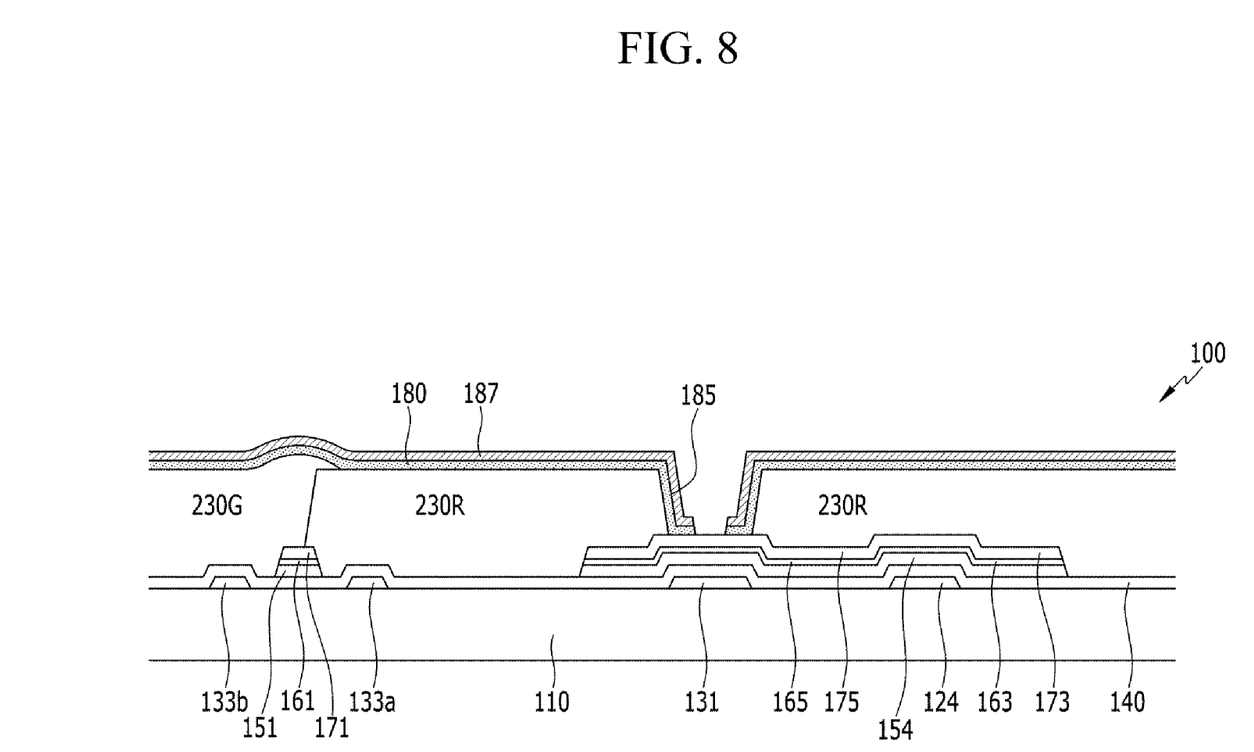

As illustrated in FIG. 8, a photosensitive film releasing process is performed to remove the photosensitive film 189 formed on the layer of the first pixel electrode 187 material.

Figure 9:
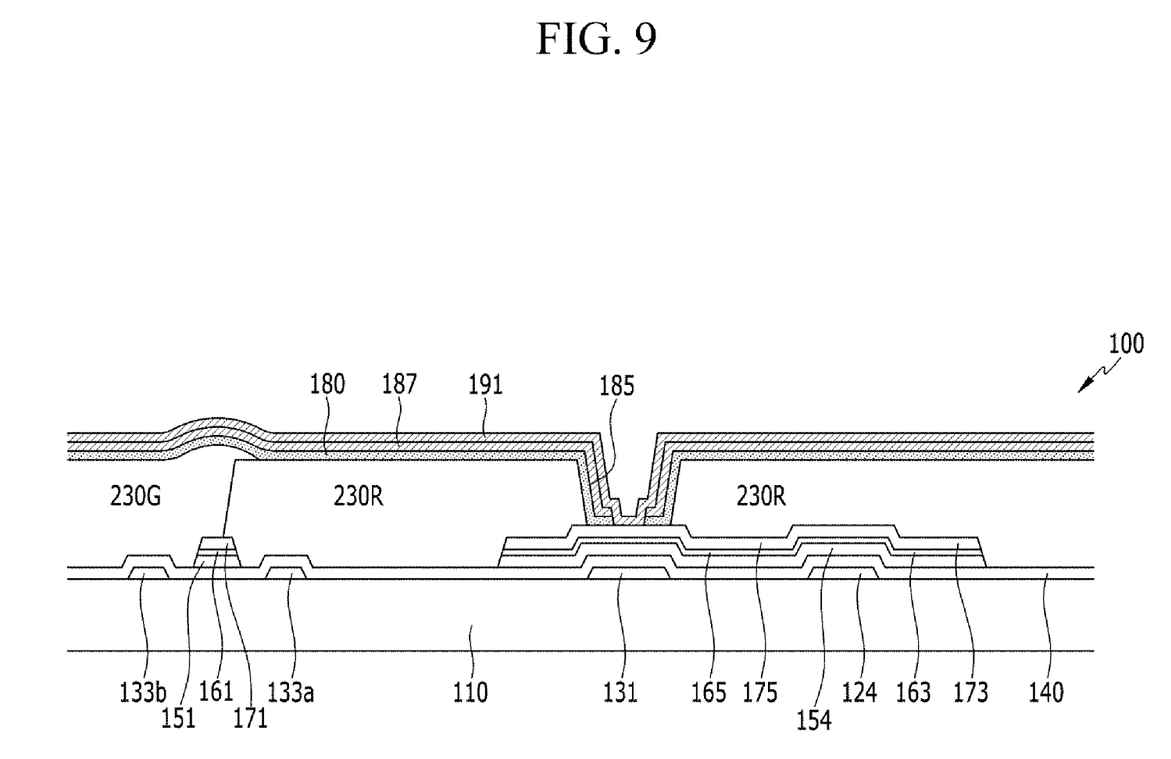
Figure 10:
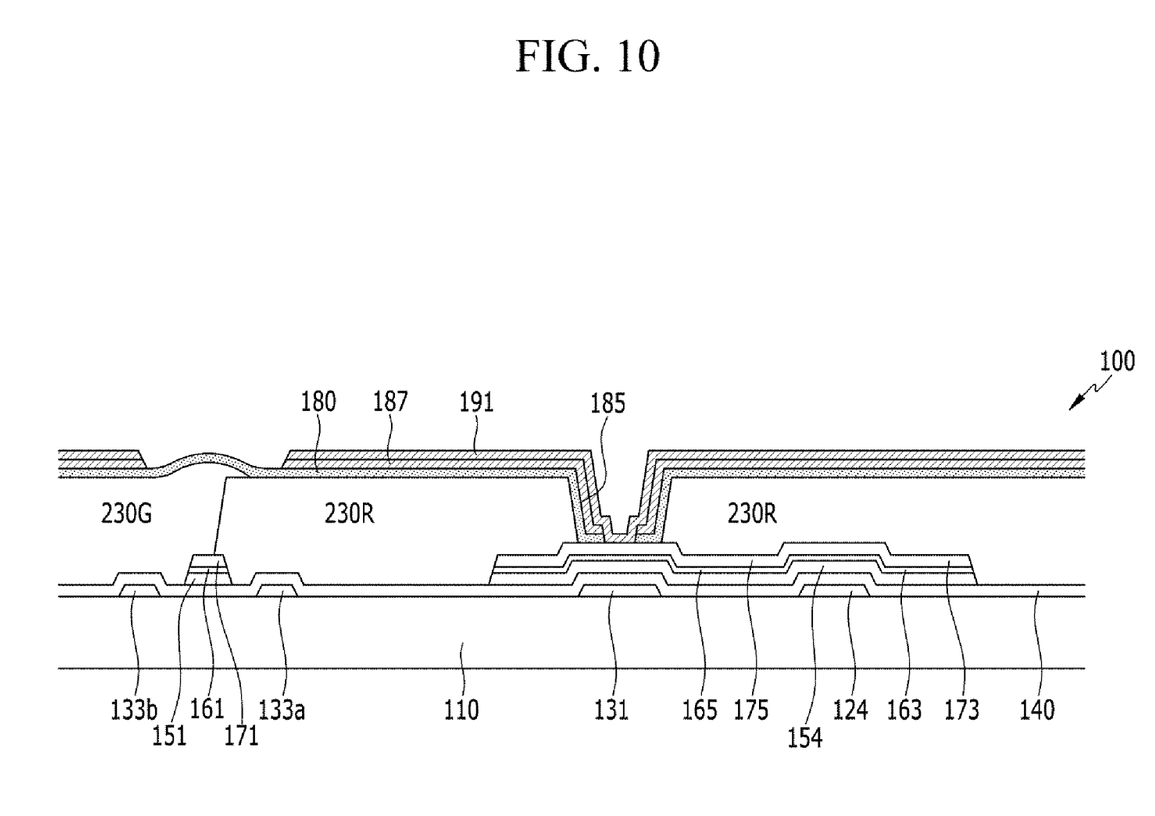

Next, as illustrated in FIG. 9, a layer of the second pixel electrode 191 material connected with the drain electrode 175 via the contact hole 185 is formed on the layer of the first pixel electrode 187 material, and as illustrated in FIG. 10, the TFT is completed by patterning the two layers of the pixel electrode materials. By patterning the two layers of the pixel electrode materials, the first and second pixel electrodes 187 and 191 are finally formed.

According to one or more exemplary embodiment of the invention described above, the first pixel electrode 187 is formed on the color filters 230R, 230G and 230B with the same transparent electrode material as the second pixel electrode 191. As a result, the portion of the pixel electrode member disposed on the exposed portion of the drain electrode 175 includes only the second pixel electrode 191, while the portion of the pixel electrode member disposed on the color filters 230R, 230G and 230B include both the first pixel electrode 187 and the second pixel electrode 191.

Further, in order to minimize a time required for the process of forming the layer of the first pixel electrode 187 material and the process of removing the portion of the layer of the first pixel electrode 187 material formed on the drain electrode 175 in the predetermined region at which the pixel electrodes 187 and 191 will be connected to each other, a deposition thickness (refer to FIG. 4) of the layer of the first pixel electrode 187 material may be less than about 300 angstroms (Å).

Figure 11:
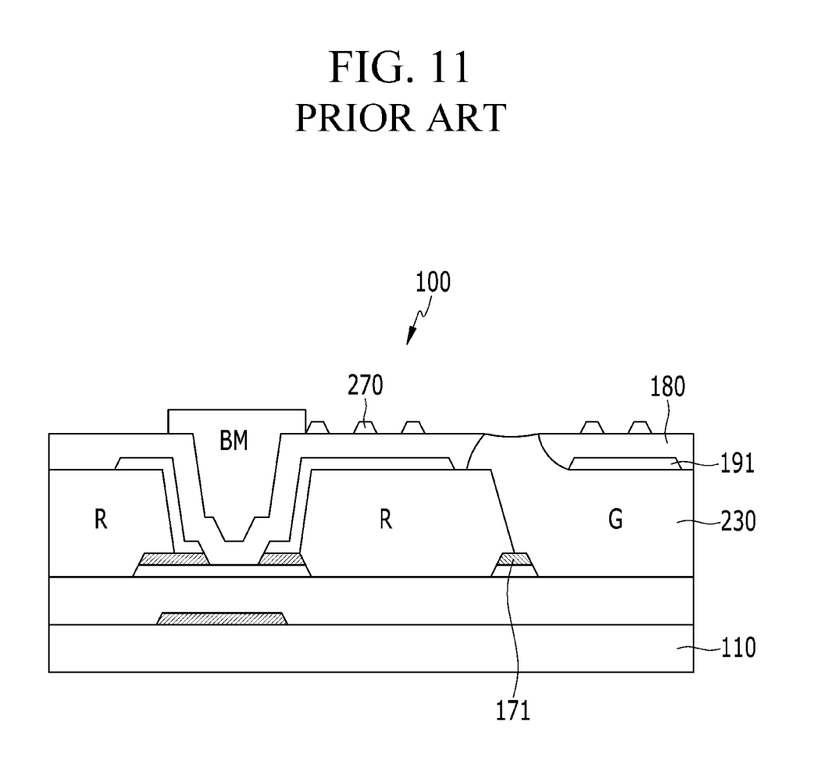
FIG. 11 is a cross-sectional view illustrating a thin film transistor array panel according to a Comparative Example.

FIG. 11 is a cross-sectional view illustrating a TFT array panel according to a Comparative Example.

Referring to FIG. 11, in the illustrated TFT array panel, only the second pixel electrode 191 and the passivation layer 180 are disposed on the color filters 230 (R, G and B). At the overlapping portion of the color filters R and G, a region of the color filter G has a thickness which is locally decreased due to the step of the overlapping portion of the color filters R and G. As a result, in the process of forming the contact hole penetrating through the color filters 230, as illustrated in FIG. 11, the passivation layer 180 material at the overlapping portion of the color filters is etched to expose the color filter G.

Where a color filter 230 is exposed, the exposed color filter 230 directly contacts and contaminates the liquid crystal layer 3 during the operation of a display device including the TFT array panel, to undesirably cause various spot defects such as contamination. Further, where reducing a size of a light blocking layer (e.g., black matrix BM) to increase an aperture ratio is desired, an exposed color filter may decrease a width of the overlapping portion of the color filters and increase a step different between the color filters.

Accordingly, according to one or more exemplary embodiment of the invention, within a TFT array panel of a COA structure-based liquid crystal display, the first pixel electrode 187 is used as the etch stopper at the overlapping portion of the color filters, such that a loss of the passivation layer at the overlapping portion of the color filters due to the step difference formed by the overlapping color filters is reduced or effectively prevented and color filter material contamination of the liquid crystal layer between display panels of such liquid crystal display is reduced or effectively prevented.

Further, according to one or more exemplary embodiment of the invention, even though the photosensitive film is relatively thinly coated, since the first pixel electrode 187 is used as the etch stopper at the overlapping portion of the color filters, loss of the passivation layer due to the dry etching process of removing the passivation layer formed on the drain electrode is reduced to improve productivity in manufacturing the TFT array panel.

While this invention has been described in connection with what is presently considered to be practical exemplary embodiments, the invention is not limited to the disclosed exemplary embodiments, but, on the contrary, is intended to cover various modifications and equivalent arrangements included within the spirit and scope of the appended claims.

What is claimed is:

1. A thin film transistor array panel, comprising:
    a gate line and a data line on a substrate, insulatively crossing each other;
    a thin film transistor connected to the gate line and to the data line;
    a first color filter overlapping the thin film transistor;
    a second color filter overlapping the first color filter;
    a passivation layer covering the first color filter and the second color filter;
    a first pixel electrode on the passivation layer, the first pixel electrode overlapping the first color filter and the second color filter; and
    a second pixel electrode on the first pixel electrode, the second pixel electrode overlapping the first color filter and the second color filter and connected with a drain electrode of the thin film transistor.

2. The thin film transistor array panel of claim 1, wherein:
    the first pixel electrode and the second pixel electrode comprise a same material.

3. The thin film transistor array panel of claim 2, wherein:
    the first pixel electrode and the second pixel electrode each comprise indium zinc oxide.

4. The thin film transistor array panel of claim 1, wherein:
    a thickness of the first pixel electrode is less than about 300 angstroms.

5. The thin film transistor array panel of claim 1, wherein:
    the first pixel electrode is between the second pixel electrode and the first color filter and between the second pixel electrode and the second color filter.

6. The thin film transistor array panel of claim 1, wherein:
    the second pixel electrode contacts the drain electrode of the thin film transistor.

7. The thin film transistor array panel of claim 1, wherein:
    a contact hole defined in both the passivation layer and the first pixel electrode exposes a portion of the drain electrode of the thin film transistor, and
    the second electrode overlaps the exposed portion of the drain electrode to be connected thereto.

8. A manufacturing method of a thin film transistor array panel, comprising:
    forming a thin film transistor on a substrate, connected to a gate line and a data line which insulatively cross each other;
    forming a first color filter overlapping the thin film transistor;
    forming a second color filter overlapping the first color filter on the thin film transistor;
    forming a passivation layer covering the first color filter and the second color filter;
    forming a first pixel electrode on the passivation layer, the first pixel electrode overlapping the first color filter and the second color filter; and
    forming a second pixel electrode on the first pixel electrode, the second pixel electrode overlapping the first color filter and the second color filter and connected to a drain electrode of the thin film transistor.

9. The manufacturing method of claim 8, wherein:
    the forming the first pixel electrode includes:
        forming a first pixel electrode material on an entire surface of the passivation layer;
        forming a photosensitive film on the first pixel electrode material;
        removing a portion of the photosensitive film at a predetermined region overlapping the drain electrode of the thin film transistor to expose the first pixel electrode material, by etching the photosensitive film; and
        removing a portion of the first pixel electrode material on the passivation layer to expose the passivation layer, by etching the first pixel electrode material, the removed portion of the first pixel electrode material formed in the predetermined region overlapping the drain electrode of the thin film transistor.

10. The manufacturing method of claim 9, wherein:
    the etching the first pixel electrode material includes a wet etching process.

11. The manufacturing method of claim 9, further comprising:
    removing the portion of the passivation layer exposed by the removed portion of the first pixel electrode material to expose the drain electrode of the thin film transistor, by etching the passivation layer, the removed portion of the passivation layer formed in the predetermined region overlapping the drain electrode of the thin film transistor.

12. The manufacturing method of claim 11, wherein:
    the etching the passivation layer includes a dry etching process.

13. The manufacturing method of claim 11, wherein:
    the forming the second pixel electrode includes:
        removing the photosensitive film formed on the first pixel electrode material; and
        forming a second pixel electrode material covering the first pixel electrode material from which the photosensitive film is removed and covering the drain electrode of the thin film transistor.

14. The manufacturing method of claim 13, further comprising:
    patterning the first and second pixel electrode material to form the first and second pixel electrodes on the passivation layer, respectively.

15. The manufacturing method of claim 8, wherein:
    the first pixel electrode and the second pixel electrode are formed from a same material.

16. The manufacturing method of claim 15, wherein:
    the first pixel electrode and the second pixel electrode are each formed from indium zinc oxide.

17. The manufacturing method of claim 8, wherein:
    a thickness of the first pixel electrode on the passivation layer is less than about 300 angstroms.

\* \* \* \* \*